(12) United States Patent (10) Patent No.: US 12,575,417 B2

Mallik et al. (45) Date of Patent: Mar. 10, 2026

(54) ELECTRONIC PACKAGE ASSEMBLY WITH STIFFENER

(71) Applicant: Intel Corporation, Santa Clara, CA (US)

(72) Inventors: Debendra Mallik, Chandler, AZ (US); Digvijay A. Raorane, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 18/112,431

(22) Filed: Feb. 21, 2023

(65) Prior Publication Data

US 2023/0197636 A1 Jun. 22, 2023

Related U.S. Application Data

(63) Continuation of application No. 16/468,266, filed as application No. PCT/US2016/069641 on Dec. 31, 2016, now abandoned.

(51) Int. Cl.
    *H01L 23/00* (2006.01)
    *H01L 23/16* (2006.01)
    (Continued)

(52) U.S. Cl.
    CPC ............ *H01L 23/562* (2013.01); *H01L 23/16* (2013.01); *H01L 23/3121* (2013.01);
    (Continued)

(58) Field of Classification Search
    CPC ... H01L 23/562; H01L 23/16; H01L 23/3121; H01L 23/3107; H01L 23/31;
    (Continued)

(56) References Cited

U.S. PATENT DOCUMENTS 6,356,453 B1    3/2002    Juskey
6,659,512 B1    12/2003   Harper
           (Continued)

FOREIGN PATENT DOCUMENTS

CN    102034718    4/2011
CN    102110660    6/2011
           (Continued)

OTHER PUBLICATIONS

Office Action for Chinese Patent Application No. 201680091265.4 mailed Jul. 31, 2023, 20 pgs.
           (Continued)

*Primary Examiner* — Dale E Page
*Assistant Examiner* — Quovaunda Jefferson
(74) *Attorney, Agent, or Firm* — Schwabe, Williamson & Wyatt P.C.

(57) ABSTRACT

An electronic package technology is disclosed. A first active die can be mountable to and electrically coupleable to a package substrate. A second active die can be disposed on a top side of the first active die, the second active die being electrically coupleable to one or both of the first active die and the package substrate. At least one open space can be available on the top side of the first active die. At least a portion of a stiffener can substantially fill the at least one open space available on the top side of the first active die.

20 Claims, 5 Drawing Sheets

(51) Int. Cl.

| | |
|---|---|
| *H01L 23/31* | (2006.01) |
| *H01L 25/00* | (2006.01) |
| *H01L 25/065* | (2023.01) |
| *H01L 25/16* | (2023.01) |

(52) U.S. Cl.
CPC .......... *H01L 25/0657* (2013.01); *H01L 25/16* (2013.01); *H01L 25/50* (2013.01); *H01L 2225/06513* (2013.01); *H01L 2225/06555* (2013.01); *H01L 2225/06582* (2013.01)

(58) Field of Classification Search
CPC . H01L 23/3114; H01L 25/0657; H01L 25/16; H01L 25/50; H01L 25/18; H01L 2225/06513; H01L 2225/06555; H01L 2225/06582; H01L 2225/06568; H01L 2225/06589; H01L 2224/16225; H01L 2924/181; H01L 24/14
See application file for complete search history.

(56) References Cited

U.S. PATENT DOCUMENTS

| | | | | |
|---|---|---|---|---|
| 8,143,097 | B2 | 3/2012 | Chi | |
| 8,247,900 | B2 | 8/2012 | Yuan | |
| 9,633,937 | B2 | 4/2017 | Fei | |
| 9,831,195 | B1 * | 11/2017 | Lu | H01L 23/13 |
| 2003/0042587 | A1 | 3/2003 | Lee | |
| 2007/0085205 | A1 | 4/2007 | Chen | |
| 2010/0109169 | A1 | 5/2010 | Kolan | |
| 2012/0018871 | A1 * | 1/2012 | Lee | H01L 23/562 |
| | | | | 257/E23.194 |
| 2012/0120614 | A1 | 5/2012 | Ueno | |
| 2013/0119560 | A1 | 5/2013 | Toh | |
| 2014/0225280 | A1 * | 8/2014 | Henderson | H01L 23/49833 |
| | | | | 438/109 |
| 2015/0262972 | A1 * | 9/2015 | Katkar | H01L 22/32 |
| | | | | 438/107 |
| 2016/0225707 | A1 | 8/2016 | Fei et al. | |

FOREIGN PATENT DOCUMENTS

| | | |
|---|---|---|
| CN | 105378920 | 3/2016 |
| CN | 106030795 | 10/2016 |
| JP | 2001223315 | 8/2001 |
| KR | 10-2009-0060309 | 6/2009 |
| KR | 10-2012-0010616 | 2/2012 |

OTHER PUBLICATIONS

Office Action for Korean Patent Application No. 10-2019-7015421 mailed Aug. 21, 2023, 8 pgs.

International Search Report and Written Opinion from International Patent Application No. PCT/US2016/069641, mailed Sep. 28, 2017, 10 Pages.

International Preliminary Report on Patentability from International Patent Application No. PCT/US2016/069641, mailed Jul. 11, 2019, 10 Pages.

Office Action for Chinese Patent Application No. 201680091265.4 mailed Nov. 18, 2022, 24 pgs., with English translation.

Office Action for Chinese Patent Application No. 201680091265.4 mailed Nov. 8, 2023, 8 pgs.

Notice of Allowance for Korean Patent Application No. 10-2019-7015421 mailed Dec. 27, 2023, 4 pgs.

Office Action for Chinese Patent Application No. 201680091265.4 mailed Sep. 6, 2024, 10 pgs.

Office Action for Chinese Patent Application No. 201680091265.4 mailed Oct. 30, 2024, 12 pgs.

* cited by examiner

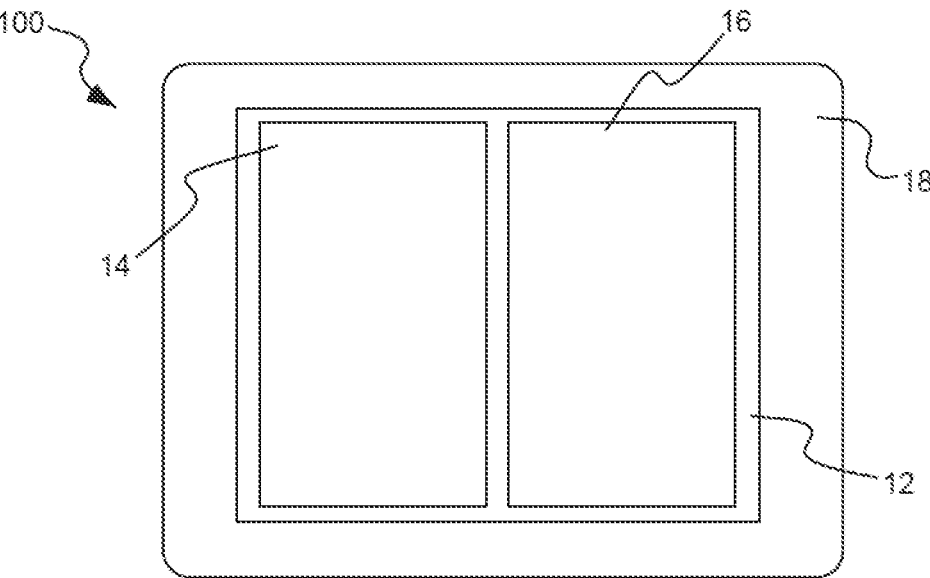
_FIG. 1_
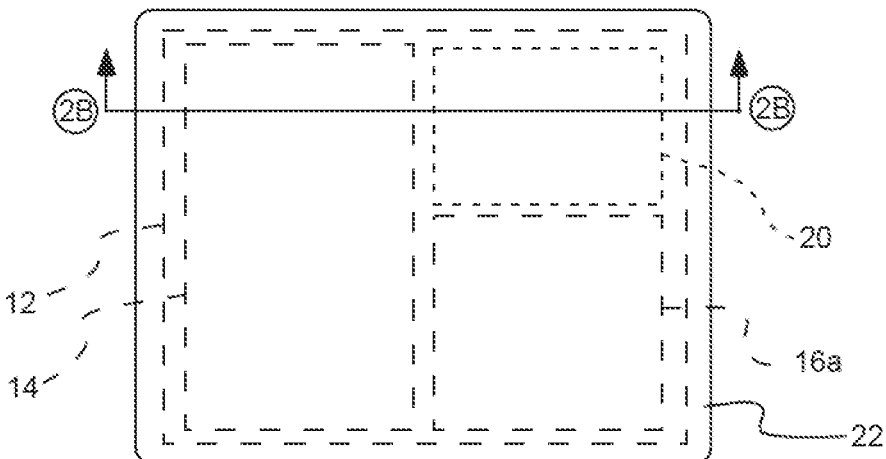
_FIG. 2A_
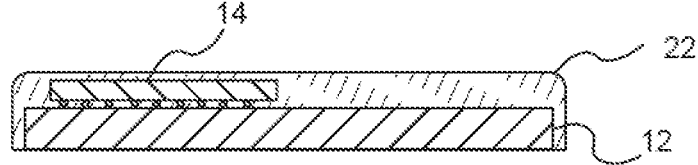
_FIG. 2B_

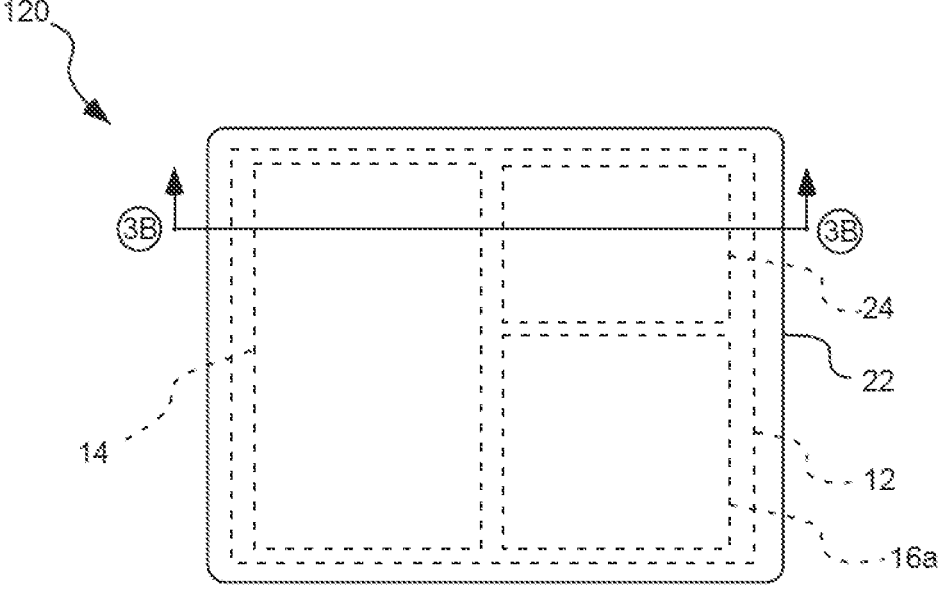
_FIG. 3A_
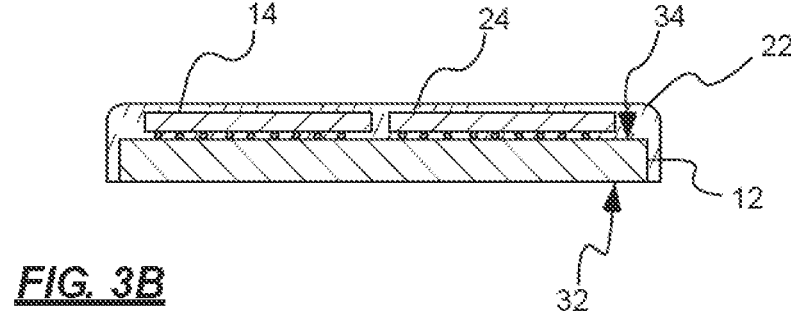
_FIG. 3B_

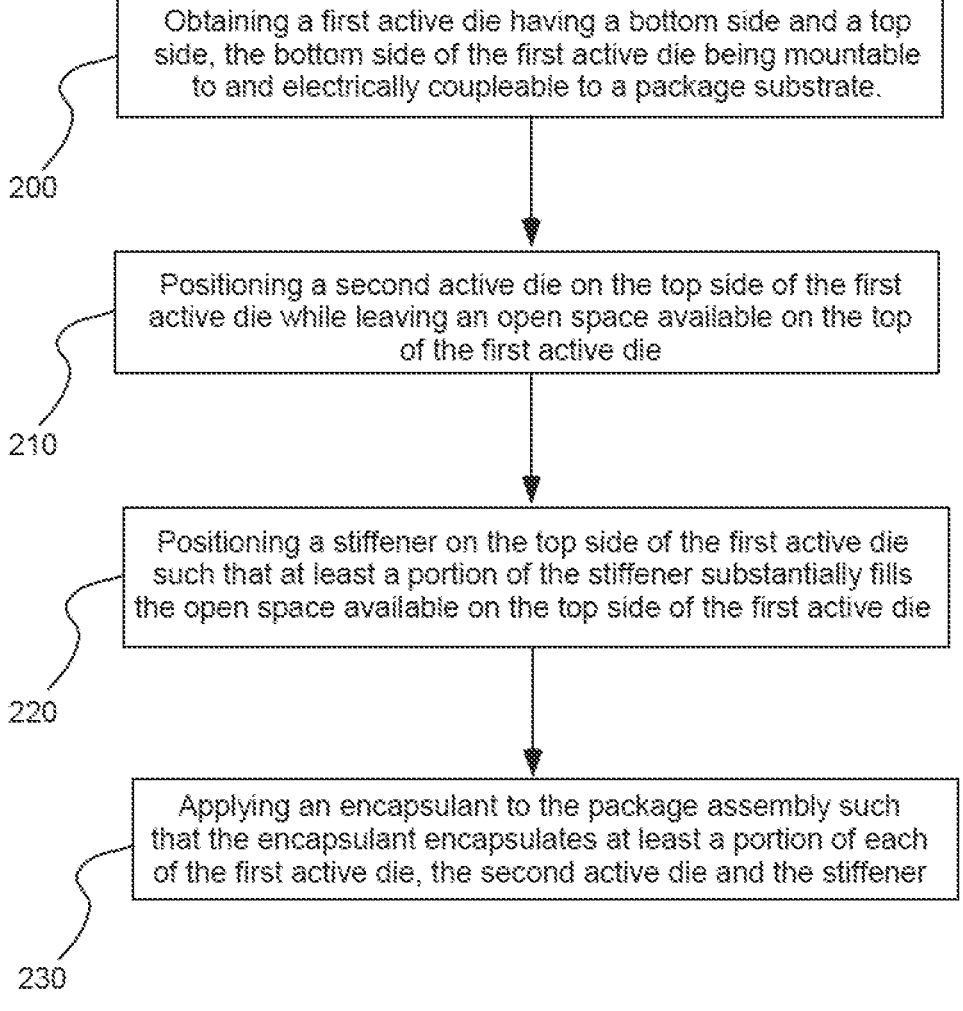

Obtaining a first active die having a bottom side and a top side, the bottom side of the first active die being mountable to and electrically coupleable to a package substrate.

200

Positioning a second active die on the top side of the first active die while leaving an open space available on the top of the first active die

210

Positioning a stiffener on the top side of the first active die such that at least a portion of the stiffener substantially fills the open space available on the top side of the first active die

220

Applying an encapsulant to the package assembly such that the encapsulant encapsulates at least a portion of each of the first active die, the second active die and the stiffener

ELECTRONIC PACKAGE ASSEMBLY WITH STIFFENER

CROSS-REFERENCE TO RELATED APPLICATIONS

This application is a continuation of U.S. patent application Ser. No. 16/468,266, filed Jun. 10, 2019, which is a U.S. National Phase application under 35 U.S.C. § 371 of International Application No. PCT/US2016/069641, filed Dec. 31, 2016, the entire contents of which are hereby incorporated by reference herein.

TECHNICAL FIELD

Embodiments described herein relate generally to electronic package assemblies, and more particularly to package assemblies having stiffeners disposed thereon.

BACKGROUND

Vertically stacking integrated circuits (ICs) to create 3D chips has emerged as a viable solution for meeting electronic device requirements such as higher performance, increased functionality, lower power consumption, scaling, and a smaller footprint. Such efforts can involve one or more top active die(s) on one large bottom active die. Typically, the top dies are designed to fully overlap the bottom die, except for narrow spaces at the edges and between the top dies. However, in many cases, there may be a relatively large space remaining open if the top dies do not adequately cover the bottom die. This large space has oftentimes conventionally been filled by a molding compound used to encapsulate the package. This large portion of molding compound formed in the open space can create issues such as local warpage and stress in the 3D chip. In addition, the bulk polymer that fills the open space can hinder heat dissipation.

BRIEF DESCRIPTION OF THE DRAWINGS

Invention features and advantages will be apparent from the detailed description which follows, taken in conjunction with the accompanying drawings, which together illustrate, by way of example, various invention embodiments; and, wherein:

FIG. 1 is a top view of an electronic package assembly in accordance with an example embodiment;

FIG. 2A is a top view of another electronic package assembly in accordance with an example embodiment;

FIG. 2B is a cross-sectional view of the package assembly of FIG. 2A, taken along section 2B-2B of FIG. 2A;

FIG. 3A is a top view of another electronic package assembly in accordance with an example embodiment;

FIG. 3B is a cross-sectional view an electronic package assembly as shown in FIG. 3A, taken along section 3B-3B of FIG. 3A;

FIG. 6 is a flowchart illustrating an exemplary method of fabricating an electronic package assembly in one example embodiment.

Figure 4:
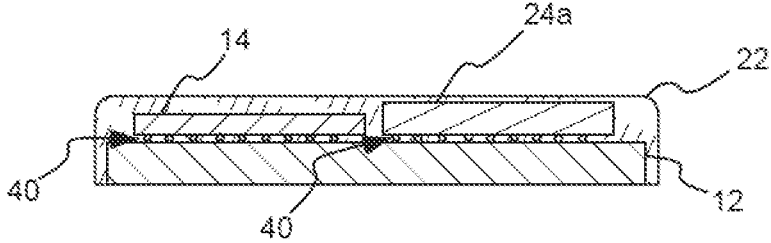
FIG. 4 is a cross-sectional view of another example of an electronic package assembly.

Reference will now be made to the exemplary embodiments illustrated, and specific language will be used herein to describe the same. It will nevertheless be understood that no limitation of the scope or to specific invention embodiments is thereby intended.

DESCRIPTION OF EMBODIMENTS

Before invention embodiments are disclosed and described, it is to be understood that no limitation to the particular structures, process steps, or materials disclosed herein is intended, but also includes equivalents thereof as would be recognized by those ordinarily skilled in the relevant arts. It should also be understood that terminology employed herein is used for the purpose of describing particular examples only and is not intended to be limiting. The same reference numerals in different drawings represent the same element. Numbers provided in flow charts and processes are provided for clarity in illustrating steps and operations and do not necessarily indicate a particular order or sequence. Unless defined otherwise, all technical and scientific terms used herein have the same meaning as commonly understood by one of ordinary skill in the art to which this disclosure belongs.

As used in this written description, the singular forms "a," "an" and "the" provide express support for plural referents unless the context clearly dictates otherwise. Thus, for example, reference to "a layer" includes support for a plurality of such layers.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the composition's nature or characteristics would be permissible if present under the "consisting essentially of" language, even though not expressly recited in a list of items following such terminology. When using an open ended term in the written description like "comprising" or "including," it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" objects or items are in physical contact with one another and attached. Objects described herein as being "adjacent to" each other may be in physical contact with each other, in close proximity to each other, or in the same general region or area as each other, as appropriate for the context in which the phrase is used. Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, sizes, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Furthermore, the described features, structures, or characteristics may be combined in any suitable manner in one or more embodiments. In this description, numerous specific details are provided, such as examples of layouts, distances, network examples, etc. One skilled in the relevant art will recognize, however, that many variations are possible without one or more of the specific details, or with other methods, components, layouts, measurements, etc. In other instances, well-known structures, materials, or operations are not shown or described in detail but are considered well within the scope of the disclosure.

Example Embodiments

An initial overview of technology embodiments is provided below and specific technology embodiments are then described in further detail. This initial summary is intended to aid readers in understanding the technology more quickly, but is not intended to identify key or essential features of the technology nor is it intended to limit the scope of the claimed subject matter.

Vertically stacking integrated circuits (ICs) or circuitry to create so-called 3D chips has emerged as a viable solution for meeting electronic device requirements such as higher performance, increased functionality, lower power consumption, and a smaller footprint. Such efforts can involve one or more top active die(s) on one large bottom active die. Because dies can have different sizes, there may be a relatively large space remaining open if the top dies do not match the shape and size of the bottom die. Typically, this space is be filled by a molding compound used to encapsulate the package. However, having such a large quantity of molding compound in the open space can create a number of issues because of its physical and thermal properties as compared to the adjacent dies and other components in the package.

Accordingly, electronic package assemblies and related methods are disclosed that fill the open, i.e. unused, space on the top of the bottom die with a structure or object having more desirable properties than a mass of pure mold compound. Such structures or objects are generally referred to herein as a "stiffener". In one aspect, warpage and stress conditions of the 3D chip structure are greatly improved by inclusion of a stiffener. Further, use of a stiffener can significantly improve heat conduction from a bottom active die to the heat spreader placed on top of the 3D chip.

With reference to FIG. 1, a vertically stacked electronic package is shown at 100. The package can include a first or bottom active die 12 with second or top active dies 14, 16 coupled or attached to an upper surface of the bottom active die. The first and second dies can each represent a discrete product or device formed of a semiconducting material, on which a functional circuit can be fabricated. The dies can be formed as is known in the art using semiconductor fabrication techniques such as thin film deposition, lithography, etching and the like used in connection with a variety of electronic devices. Each of the dies may include, or be a part of, a processor, computer memory, platform controller hub, etc. In one embodiment, each of the dies 12, 14, 16 can represent a discrete chip. The dies can be, include, or be a part of a processor, memory, system-on-a-chip (SoC) or application specific integrated circuit (ASIC).

One or more dies can be attached to a substrate 18 according to a variety of suitable configurations including a flip-chip configuration, wire bonding, and the like. The dies can be electrically coupled to the substrate 18 using a variety of known methods, including interconnect structures (not shown) configured to route electrical signals between the dies and the substrate. In some embodiments, the interconnect structure may be configured to route electrical signals such as, for example, I/O signals and/or power or ground signals associated with the operation of the dies 12, 14, 16.

The substrate 18 can take a variety of known forms and can include electrically conductive elements or electrical routing features (not shown) configured to route electrical signals to or from the dies 12, 14, 16. The electrical routing features may be internal and/or external to the substrate 18. For example, in some embodiments, the substrate can include electrical routing features such as pads, vias, and/or traces configured to receive interconnect structures and route electrical signals to or from dies, and to or from an underlying circuit board, motherboard, etc., to which the substrate can be connected.

In the example shown in FIG. 1, the second or top dies 14, 16 consume nearly all of the available space atop the bottom or first die 12. In this example, only very small spaces remain between the two dies, and between outer side edges of the top dies and side edges of the bottom die. Once the top dies are attached to the bottom die, the overall package can be encapsulated with an encapsulant, such as a polymer or other suitable material. One such exemplary encapsulant is shown by example at 22 in FIGS. 2A-5.

The arrangement illustrated in FIG. 1 performs well in the case where the overall space occupied by the second or top dies 14, 16 consumes nearly all of the available space atop the first or bottom die 12. However, it is sometimes the case that the top dies are sized or shaped such that a relatively large open space atop the bottom die remains unconsumed by the top dies. This arrangement is shown in FIG. 2A, where it can be seen that top dies 14, 16a do not consume the available space on bottom die 12. Instead an open space (shown schematically at 20) atop die 12 remains unfilled by top die structure.

When encapsulant 22 is applied over the second or top dies 14, 16a and the bottom or first die 12, the open space 20 is filled by a large, or at least comparatively large mass encapsulant material, as best appreciated from FIG. 2B. This large portion of encapsulant can be problematic in that its physical and thermal properties may be less than ideally matched with those of the surrounding environment. For example, local warpage and stress can be created in this area. This bulk of encapsulant can also hinder heat dissipation. As explained further below, the use of a stiffener to fill the open space instead of a mass of encapsulant can resolve or alleviate such issues and improve performance and overall operation.

As shown in FIGS. 3A and 3B, in this example an electronic package assembly 120 is provided that can include a first or bottom active die 12 that can include a bottom side 32 and a top side 34 (FIG. 3B). The bottom side of the first active die can be mountable to and electrically coupleable to a package substrate (such as that shown by example at 18 in FIG. 1). One or more second or top active dies 14, 16a can be disposed on the top side of the first active die. The second active die(s) can be electrically coupleable to one or both of the first active die and the package substrate. At least one open space can be available on the top side of the first active die. In this example, the open space is substantially filled by at least a portion of the stiffener 24. An encapsulant 22 can encapsulate at least a portion of each of the first or bottom active die 12, the second or top active dies 14, 16a and the stiffener 24.

In this manner, the use of excess (e.g. a large mass) of encapsulant 22 to fill an otherwise unused space atop the bottom or first active die 12 is avoided. A material, shape, size or configuration of the stiffener can be selected to provide it with desired physical and/or thermal properties in view of the needs of the environment into which it will be placed. For example, the stiffener can be configured to provide a desired stress reaction in the area consumed by the stiffener, a desired thermal conductivity or a coefficient of thermal expansion ("CTE"), etc. As will be appreciated from FIG. 3A, the shape and size of the stiffener 24 can be selected such that a width of the stiffener is substantially the same as a width of active die 16a, and a combined length of the stiffener and active die 16a is substantially the same as a length of active die 14. As will be appreciated from FIG. 3B, a height of the stiffener 24 can be selected to substantially match a height of active die 14. In this manner, application of the encapsulant 22, and various finishing, polishing, etching, etc., processes typically done after application of the encapsulant to conventional 3D chips, can be performed as usual with the stiffener attached.

It should be noted that while depicted as primarily rectangular in FIGS. 3A and 3B, the stiffener can take any shape or size needed in view of a shape or size of a space which the stiffener is intended to occupy. For example, circular, triangular, square, oval, crescent, hexagonal, trapezoidal, or other shapes can be used.

As shown in FIG. 3A, the combination of the second or top active dies 14, 16a, and the stiffener 24, can cover substantially all of the upper surface of the first or bottom active die 12. In most 3D chip applications, small gaps or spaces remain between the top dies, and between side edges of the top dies and side edges of the bottom die. In some embodiments, the stiffener can be shaped and sized to remain consistent with this practice. In one example, the combination of the top or second dies and the stiffener cover about 90% or more of the available surface area atop the first or bottom die.

Physical properties of the stiffener 24 can be tailored to achieve any of a variety of design goals. For example, the stiffener can be formed more rigid than is a portion of the encapsulant corresponding in shape and size to the at least one open space. It will be appreciated by comparing FIGS. 2A and 2B with FIGS. 3A and 3B, that the physical space consumed by the stiffener 24 of FIGS. 3A and 3B is substantially the same as that consumed by open space 20 of FIGS. 2A and 2B. However, the stiffener can be formed fully or partially from a material selected such that a rigidity of the stiffener is greater than a rigidity of a corresponding portion of encapsulant. The stiffener can be formed from a variety of materials, including without limitation, metals, glass, ceramics, silicon, etc. The stiffener can be formed from a unitary portion of a single material, or a plurality of materials (e.g. a composite) that can be selected to collectively provide the desired characteristics.

Various material choices for the stiffener 24 can provide various advantages. For example, silicon can be advantageous in that it can be obtained for relatively low cost, and can provide roughly the same structural properties (CTE, Young's Modulus, etc.) as the top or second active die(s) 14, 16*a*, etc. Silicon also provides good thermal conduction and can also easily include additional materials or components formed thereon or therein. Ceramics can typically be provided at even lower cost, and can have built-in capacitance. Metals can be obtained at very low cost and also provide good thermal conduction. All of these materials can be chosen to obtain desired structural properties tuned to best perform with the overall 3D chip characteristics and design.

In one example, the stiffener 24 can include or exhibit a thermal conductivity that is greater than the encapsulant 22. This can allow the stiffener to better conduct heat from the assembly than if the encapsulant filled open space 20. In one example, the stiffener can have a coefficient of thermal expansion substantially the same as does the second active die. In this manner, undesirable stress is not introduced to the electronic package assembly due to differing thermal expansion rates. The stiffener can include a material having a Young's Modulus greater than does the encapsulant.

In the example shown in FIG. 4, stiffener 24*a* includes a different height than the height of the top or second active die 14. In the example shown, an upper surface of the stiffener protrudes higher than does the active die. In other examples, the height of the stiffener can be less than or equal to the active die. By varying the height of the stiffener, different physical properties of the stiffener can be tuned without necessarily changing the material of the stiffener. In addition to varying the height of the stiffener, the stiffener can include stiffening features (not shown in detail) that increase or decrease a rigidity of the stiffener. Examples of such features include, without limitation, perforations or indentations, reinforcing ribs, etc.

As also shown in FIG. 4, in embodiment, the top or second die 14 can be coupled to the first or bottom die 12 via solder bumps 40. Such a process, known as "controlled collapse chip connection" (or "C4") can be used to attach top or second dies to the bottom or first die 12. The same process can also be used to attach the stiffener 24*a*. In this manner, a different or distinct process step need not be provided to attach the stiffener in a dedicated manner. The use of soldering techniques can allow the stiffener to be attached to the bottom die 12 as an electrically active component. Other techniques can also be used to attach the stiffener, however, such as the use of an adhesive. In this manner, the stiffener can be included within the package assembly as an electrically passive element.

Figure 5:
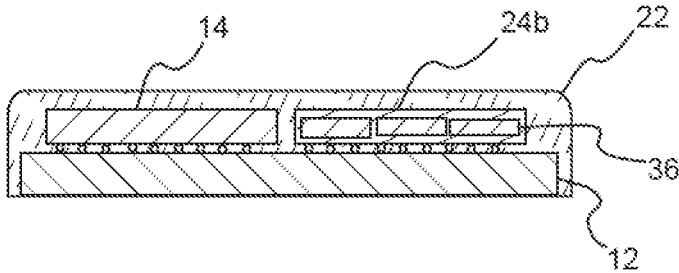
FIG. 5 is a cross-sectional view of another example of an electronic package assembly.

As shown in the embodiment of FIG. 5, the stiffener 24*b* can carry one or more features advantageous to operation of the electrical package assembly. In the example shown, the stiffener 24*b* can carry one or more capacitors 36. The capacitors can be used in a variety of manners, and can be in electrical communication with one or more of the dies 12, 14, 16, etc. and the substrate 18.

While the figures illustrate use of a single stiffener 24 atop a first or bottom die 12, it is to be understood that a plurality of stiffeners can be applied atop a bottom chip, where desired. Also, more or less than the two top dies 14, 16 can be applied atop the bottom die 12. The stiffeners and dies can each vary in size and/or shape.

FIG. 6 illustrates an exemplary method of fabricating an electronic package assembly. In this example, a first active die is obtained at 200. The first active die can have a bottom side and a top side, the bottom side of the first active die being mountable to and electrically coupleable to a package substrate. At 210, a second active die can be positioned on the top side of the first active die while leaving an open space available on the top of the first active die. At 220, a stiffener can be positioned on the top side of the first active die such that at least a portion of the stiffener substantially fills the open space available on the top side of the first active die. At 230, an encapsulant can be applied to the package assembly such that the encapsulant encapsulates at least a portion of each of the first active die, the second active die and the stiffener.

Figure 7:
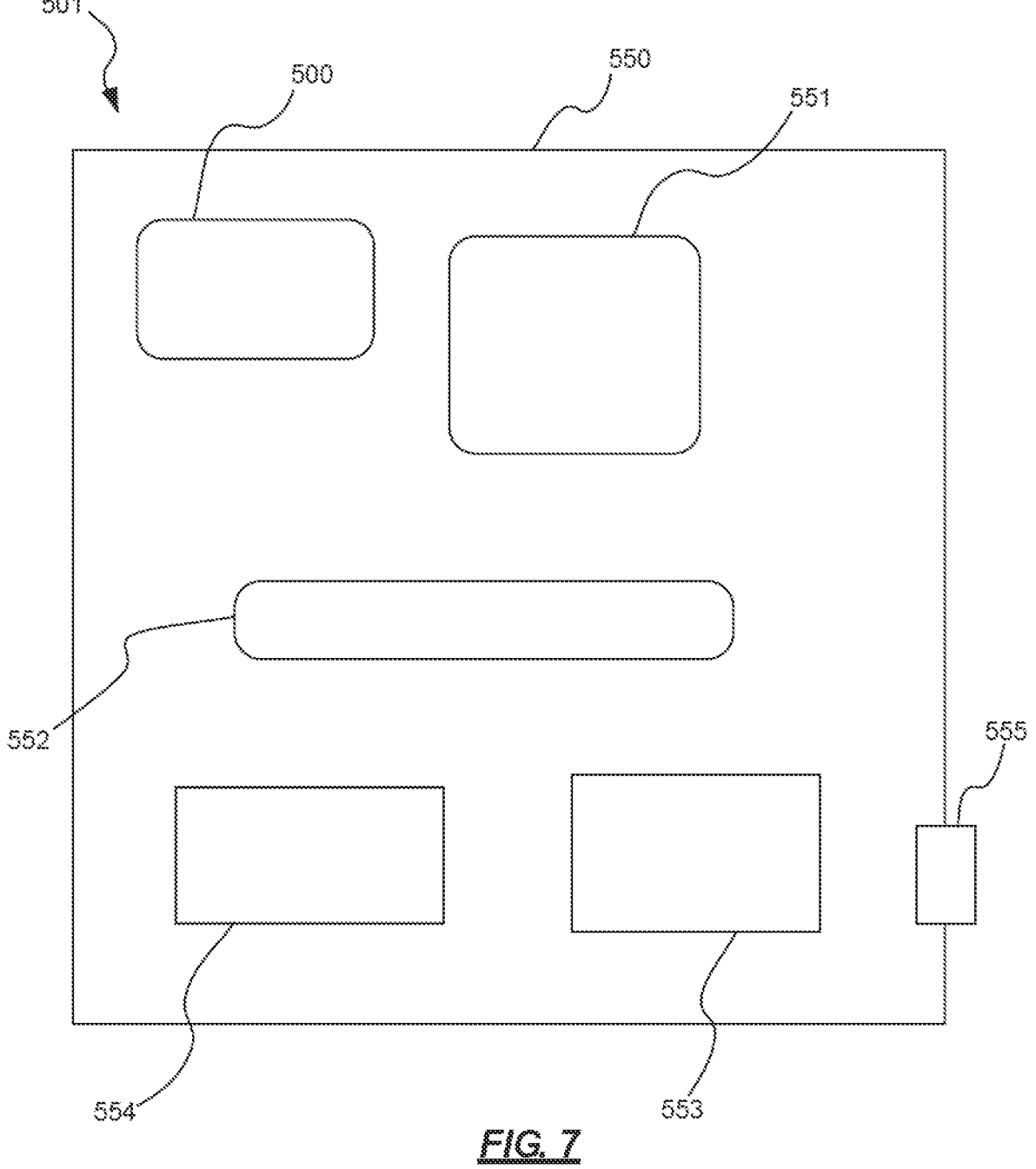
FIG. 7 is a schematic illustration of an exemplary computing system.

FIG. 7 illustrates an example computing system 501. The computing system 501 can include an electronic package assembly 500 as disclosed herein, coupled to a motherboard 550. In one aspect, the computing system 501 can also include a processor 551, a memory device 552, a radio 553, a heat sink 554, a port 555, a slot, or any other suitable device or component, which can be operably coupled to the motherboard 550. The computing system 501 can comprise any type of computing system, such as a desktop computer, a laptop computer, a tablet computer, a smartphone, a wearable device, a server, various MEMS devices, etc. Other embodiments need not include all of the features specified in FIG. 7, and may include alternative features not specified in FIG. 7.

Examples

The following examples pertain to further embodiments.

In one example there is provided an electronic package assembly including a first active die having a bottom side and a top side, the bottom side of the first active die being mountable to and electrically coupleable to a package substrate. A second active die is disposed on the top side of the first active die, the second active die being electrically coupleable to one or both of the first active die and the package substrate. At least one open space is available on the top side of the first active die. At least a portion of a stiffener substantially fills the at least one open space available on the top side of the first active die.

In one example of an electronic package assembly, an encapsulant encapsulates at least a portion of each of the first active die, the second active die and the stiffener.

In one example of an electronic package assembly, the stiffener is more rigid than is a portion of the encapsulant corresponding in shape and size to the at least one open space.

In one example of an electronic package assembly, the stiffener is electronically passive.

In one example of an electronic package assembly, one or more capacitors are carried by the stiffener.

In one example of an electronic package assembly, an upper surface of the stiffener is substantially level with an upper surface of the second active die.

In one example of an electronic package assembly, an upper surface of the stiffener is positioned at a different height than an upper surface of the second active die.

In one example of an electronic package assembly, the stiffener is attached to the first active die by a soldered connection.

In one example of an electronic package assembly, the stiffener is attached to the first active die with an adhesive.

In one example of an electronic package assembly, the stiffener is formed from a material selected from the group consisting of: a polymer, glass, silicon, ceramic and metal.

In one example of an electronic package assembly, the stiffener has a greater thermal conductivity than does the encapsulant.

In one example of an electronic package assembly, the stiffener has a coefficient of thermal expansion substantially the same as the second active die.

In one example of an electronic package assembly, the stiffener includes a material having a Young's Modulus greater than the encapsulant.

In one example of an electronic package assembly, a package substrate is provided, the first active die is mounted to and electrically coupled to the package substrate.

In one example of an electronic package assembly, the second active die and the stiffener collectively cover at least about 90% of an upper surface of the first active die.

In one example of an electronic package assembly, the encapsulant substantially completely encapsulates the first active die, the second active die and the stiffener.

In one example of an electronic package assembly, a plurality of stiffeners fill the at least one open space on the top side of the first active die.

In one example of an electronic package assembly, a plurality of second active dies are arranged on the top side of the first active die.

In one example of an electronic package assembly, at least some of the plurality of second active dies differ in size and/or shape.

In one example there is provided a computing system, including a motherboard and an electronic package assembly, the package assembly being operably coupled to the motherboard. The electronic package assembly includes a first active die having a bottom side and a top side, the bottom side of the first active die being mountable to and electrically coupleable to a package substrate. A second active die is disposed on the top side of the first active die, the second active die being electrically coupleable to one or both of the first active die and the package substrate. At least one open space is available on the top side of the first active die. At least a portion of a stiffener substantially fills the at least one open space available on the top side of the first active die. An encapsulant encapsulates at least a portion of each of the first active die, the second active die and the stiffener.

In one example of a computing system, the computing system comprises a desktop computer, a laptop, a tablet, a smartphone, a wearable device, a server, or a combination thereof.

In one example of a computing system, the system includes a processor, a memory device, a heat sink, a radio, a slot, a port, or a combination thereof operably coupled to the motherboard.

In one example of a computing system, a plurality of package substrates are operably coupled to the motherboard.

In one example there is provided a method of fabricating an electronic package assembly, comprising obtaining a first active die having a bottom side and a top side, the bottom side of the first active die being mountable to and electrically coupleable to a package substrate; positioning a second active die on the top side of the first active die while leaving an open space available on the top of the first active die; positioning a stiffener on the top side of the first active die such that at least a portion of the stiffener substantially fills the open space available on the top side of the first active die; and applying an encapsulant to the package assembly such that the encapsulant encapsulates at least a portion of each of the first active die, the second active die and the stiffener.

In one example of a method of fabricating an electronic package assembly the stiffener is more rigid than is a portion of the encapsulant corresponding in shape and size to the at least one open space.

In one example of a method of fabricating an electronic package assembly, the stiffener is electronically passive.

In one example of a method of fabricating an electronic package assembly, one or more capacitors are carried by the stiffener.

In one example of a method of fabricating an electronic package assembly, positioning the stiffener includes positioning an upper surface of the stiffener to be substantially level with an upper surface of the second active die.

In one example of a method of fabricating an electronic package assembly further comprises attaching the stiffener to the first active die by a soldered connection.

In one example of a method of fabricating an electronic package assembly further comprises attaching the stiffener to the first active die with an adhesive.

In one example of a method of fabricating an electronic package assembly, the stiffener is formed from a material selected from the group consisting of: a polymer, glass, silicon, ceramic and metal.

In one example of a method of fabricating an electronic package assembly, the stiffener has a greater thermal conductivity than does the encapsulant.

In one example of a method of fabricating an electronic package assembly, the stiffener has a coefficient of thermal expansion substantially the same as the second active die.

In one example of a method of fabricating an electronic package assembly, the stiffener includes a material having a Young's Modulus greater than the encapsulant.

In one example of a method of fabricating an electronic package assembly further comprises mounting the first active die to a package substrate and electronically coupling the first active die to the substrate.

In one example of a method of fabricating an electronic package assembly, the second active die and the stiffener collectively cover at least about 90% of an upper surface of the package substrate.

In one example of a method of fabricating an electronic package assembly, applying the encapsulant further comprises substantially completely encapsulating the first active die, the second active die and the stiffener with the encapsulant.

In one example of a method of fabricating an electronic package assembly, positioning the stiffener further comprises positioning a plurality of stiffeners to fill the at least one open space on the top side of the first active die.

In one example of a method of fabricating an electronic package assembly, positioning the second active die further comprises positioning a plurality of second active dies on the top side of the first active die.

In one example of a method of fabricating an electronic package assembly, at least some of the plurality of second active dies differ in size and/or shape.

Circuitry used in electronic components or devices (e.g. a die) of an electronic package assembly can include hardware, firmware, program code, executable code, computer instructions, and/or software. Electronic components and devices can include a non-transitory computer readable storage medium that can be a computer readable storage medium that does not include signal. In the case of program code execution on programmable computers, the computing devices recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object oriented programming language to communicate with a computer system. However, the program(s) may be implemented in assembly or machine language, if desired. In any case, the language may be a compiled or interpreted language, and combined with hardware implementations.

While the forgoing examples are illustrative of the specific embodiments in one or more particular applications, it will be apparent to those of ordinary skill in the art that numerous modifications in form, usage and details of implementation can be made without departing from the principles and concepts articulated herein.

What is claimed is:

1. An electronic package, comprising:
   a bottom active semiconductor die, wherein the bottom active semiconductor die is a processor, wherein the bottom active semiconductor die comprises a semiconducting material having a circuit directly thereon, and wherein the bottom active semiconductor die has a footprint;
   a top active die atop the bottom active semiconductor die, wherein the top active die is a memory die, and wherein the top active die is entirely within the footprint of the bottom active semiconductor die;
   a stiffener atop the bottom active semiconductor die, the stiffener laterally spaced apart from the top active die, and the stiffener comprising a unitary portion of silicon, wherein the stiffener has an uppermost surface at a same level as an uppermost surface of the top active die; and
   an encapsulant between the stiffener and the top active die, the encapsulant in contact with a side of the top active die, the encapsulant in contact with a side of the stiffener, and the encapsulant over the bottom active semiconductor die.

2. The electronic package of claim 1, wherein the top active die and the stiffener cover about 90% or more of the available surface area of the bottom active semiconductor die.

3. The electronic package of claim 1, wherein the encapsulant is further over the top active die and the stiffener.

4. The electronic package of claim 1, wherein the top active die is electrically coupled to the bottom active semiconductor die.

5. The electronic package of claim 1, wherein the top active die is coupled to the bottom active semiconductor die by C4 connections.

6. The electronic package of claim 1, wherein the stiffener has a greater rigidity than the encapsulant.

7. The electronic package of claim 1, wherein the stiffener is electrically passive.

8. The electronic package of claim 1, further comprising:
   a package substrate, wherein the bottom active semiconductor die is mounted on and electrically coupled to the package substrate.

9. The electronic package of claim 8, wherein the encapsulant is along sides of the package substrate.

10. An electronic package, comprising:
   a semiconductor processor die having a top side above a bottom side, wherein the semiconductor processor die comprises a semiconducting material having a circuit directly thereon, and wherein the semiconductor processor die has a footprint;
   a memory die electrically coupled to the top side of the semiconductor processor die, and wherein the memory die is entirely within the footprint of the semiconductor processor die;
   a piece of silicon coupled to the top surface of the semiconductor processor die, the piece of silicon laterally spaced apart from the memory die, wherein a height of the piece of silicon substantially matches a height of the memory die, and wherein the piece of silicon is electrically passive; and
   an encapsulant between the piece of silicon and the memory die, the encapsulant in contact with a side of the memory die, the encapsulant in contact with a side of the piece of silicon, and the encapsulant over the semiconductor processor die.

11. The electronic package of claim 10, wherein the memory die and the piece of silicon cover about 90% or more of the top side of the semiconductor processor die.

12. The electronic package of claim 10, wherein the encapsulant is further over the memory die and the piece of silicon, and wherein the piece of silicon has a greater rigidity than the encapsulant.

13. The electronic package of claim 10, further comprising:
   a package substrate, wherein the semiconductor processor die is mounted on and electrically coupled to the package substrate.

14. An electronic package, comprising:
   a semiconductor processor die, wherein the semiconductor processor die comprises a semiconducting material having a circuit directly thereon, and wherein the semiconductor processor die has a footprint;
   a memory die mounted on the semiconductor processor die, and wherein the top memory die is entirely within the footprint of the semiconductor processor die;
   a portion of silicon mounted on the semiconductor processor die, the portion of silicon laterally spaced apart from the memory die, wherein a height of the portion of silicon is substantially the same as a height of the memory die; and
   an encapsulant material over the memory die, over the portion of silicon, and laterally between the portion of silicon and the memory die.

15. The electronic package of claim 14, wherein the memory die and the portion of silicon cover about 90% or more of the available surface area of the semiconductor processor die.

16. The electronic package of claim 14, wherein the memory die is electrically coupled to the semiconductor processor die.

17. The electronic package of claim 16, wherein the memory die is electrically coupled to the semiconductor processor die by C4 connections.

18. The electronic package of claim 14, wherein the portion of silicon is electrically passive.

19. The electronic package of claim 14, further comprising:
   a package substrate, wherein the semiconductor processor die is mounted on the package substrate.

20. The electronic package of claim 19, wherein the encapsulant material is along sides of the package substrate.

\* \* \* \* \*